United States Patent
Lin et al.

(10) Patent No.: US 6,738,956 B2
(45) Date of Patent: May 18, 2004

(54) CIRCUIT CONFIGURATION OF A CHIP WITH A GRAPHIC CONTROLLER INTEGRATED AND METHOD FOR TESTING THE SAME

(75) Inventors: Jiing Lin, Taipei (TW); Hsuan-Yi Wang, Taipei (TW); Chun-Yi Wu, Taipei (TW); Kuang-Yu Tang, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/216,174

(22) Filed: Aug. 12, 2002

(65) Prior Publication Data

US 2003/0149948 A1 Aug. 7, 2003

(30) Foreign Application Priority Data

Feb. 1, 2002 (TW) ........................................ 91101715 A

(51) Int. Cl.$^7$ .............................................. G06F 17/50
(52) U.S. Cl. .................................. 716/4; 716/5; 716/6
(58) Field of Search ................................ 716/4, 5, 6, 1

(56) References Cited

U.S. PATENT DOCUMENTS

| | | | | |
|---|---|---|---|---|
| 5,650,955 A | * | 7/1997 | Puar et al. .................... 365/51 |
| 5,678,009 A | * | 10/1997 | Bains et al. ................. 710/125 |
| 5,920,881 A | * | 7/1999 | Porterfield ....................... 711/2 |
| 5,991,833 A | * | 11/1999 | Wandler et al. ................ 710/52 |
| 6,101,566 A | * | 8/2000 | Woods et al. ................ 710/315 |
| 6,192,457 B1 | * | 2/2001 | Porterfield .................. 711/206 |
| 6,211,891 B1 | * | 4/2001 | Wahlig ........................ 345/531 |
| 6,542,844 B1 | * | 4/2003 | Hanna ......................... 702/120 |
| 2001/0049771 A1 | * | 12/2001 | Tischler et al. ............. 711/133 |

* cited by examiner

Primary Examiner—Matthew Smith
Assistant Examiner—Sun James Lin
(74) Attorney, Agent, or Firm—Rosenberg, Klein & Lee

(57) ABSTRACT

The present invention generally relates to a circuit configuration of a chip and, more particularly to a circuit configuration of a chip with a graphic controller integrated and a method for testing such a circuit configuration, in which a test circuit is employed in a main control module such that a graphic controller is directly connected to a plurality of buses in a testing mode. Thus, the testing of the graphic controller is independent of the main controller module. Moreover, the testing requests are transmitted to the graphic controller by using frequency multiplying modes, and at least one multiplexer and at least one latch are used at the memory end, so that the required pin count for testing is lowered in the present invention.

14 Claims, 4 Drawing Sheets

CIRCUIT CONFIGURATION OF A CHIP WITH A GRAPHIC CONTROLLER INTEGRATED AND METHOD FOR TESTING THE SAME

BACKGROUND OF THE INVENTION

1. Field of the Invention

The present invention generally relates to a circuit configuration of a chip and, more particularly to a circuit configuration of a chip with a graphic controller integrated and a method for testing such a circuit configuration, in which a test circuit is employed in a main control module such that a graphic controller is directly connected to a plurality of buses in a testing mode. In this manner, a plurality of testing requests are transmitted to the graphic controller by using frequency multiplying modes and the required pin count for testing is lowered by using at least one multiplexer and one latch at the memory end.

2. Description of the Prior Art

In recent years, with the high development in information-related industries and the trend that the electronic products are continuously downsized, more and more electronic devices have been successfully integrated on one chip. Conventionally, a graphic chip is fabricated as an independent chip since the great amount of employed devices may occupy a large area. However, with the tremendous improvement in semiconductor processing technology, it is no more difficult to integrate such a graphic chip and the north bridge circuit on one chip. This has attracted lots of attention from the industries.

A number of testing processes are necessary for any of the newly designed products to examine if the features provided by such devices can function normally according to the specifications. In general, the circuit configuration of a north bridge chip with integrated graphic functions is shown as in FIG. 1, which comprises: a graphic controller 181 and a north bridge circuit 183. The north bridge circuit 183 includes a front side bus (FSB) controller 182, a memory controller 184 and a peripheral component interconnect (PCI) controller 186. More particularly, the FSB controller 182 is connected through a front side bus 125 to a central process unit (CPU) 12. The memory controller 184 is connected through a memory bus 145 to a memory 14. The PCI controller 186 is connected to a plurality of peripheral components through a PCI bus 185. The graphic controller 181 is connected to a displayer 16. When an integrated chip 18 is to be tested, a series of testing requests corresponding to the items to be tested are input into the integrated chip 18. Then the results from the displayer 16 and the memory 14 are compared to the expected values to determine whether the design of the product is perfect.

Nevertheless, the state-of-the-art information technology improves with each passing day. Most of the interface specifications that were ever popular have gradually been replaced by the newer ones. For example, the specifications related to the north bridge circuit 183 include a wide range (such as FSBs of various frequency of clock specifications, PCI bus interconnections and V-link interconnections between the north bridge and the south bridge, and interconnections for memories of various specifications) and are updated very fast. On the contrary, the graphic controller 181 changes relatively slowly in its specifications. In average, as the graphic controller specification is updated once, the north bridge specification may have been updated five times. However, the circuit configuration of the conventional integrated chip as well as its testing method cannot allow the testing of the graphic controller to be independent of the north bridge circuit. For a newly designed integrated chip that comprises the same graphic controller and a different north bridge in specification, the entire testing process is required to repeat for the change in the north bridge so as to obtain the values for comparison. However, it takes 6 to 8 months to obtain a set of such values, which is time-consuming and disadvantageous for a new product. On the other hand, the downsized chip results in a lower pin count, which leads to an insufficient pin count for the testing of the graphic controller.

Therefore, there is need in providing a circuit configuration of a chip with a graphic controller integrated and a method for testing such a circuit configuration in view of the above problems such that the testing procedures for the graphic controller and the north bridge circuit can be separated, the required pin count for testing is lowered, the testing data can be reused, and the time consumed for testing can be shortened.

SUMMARY OF THE INVENTION

Accordingly, it is the primary object of the present invention to provide a circuit configuration of a chip with a graphic controller integrated, in which a test circuit is employed in a main control module such that a graphic controller is directly connected to a plurality of buses through the test circuit in a testing mode.

It is another object of the present invention to provide a circuit configuration of a chip with a graphic controller integrated, in which the test circuit further comprises a frequency converter for converting the clock frequency for data transmission between a front side bus and the graphic controller.

It is still another object of the present invention to provide a circuit configuration of a chip with a graphic controller integrated, in which the test circuit further comprises at least one multiplexer so as to lower the required pin count between the graphic controller and the buses.

It is still another object of the present invention to provide a method for testing a circuit configuration, in which a plurality of testing requests are transmitted to the test circuit by using a frequency multiplying mode and then converted into a single-frequency mode transmitted to the graphic controller so as to lower the pin count needed for testing.

In order to achieve the foregoing objects, the present invention provides a circuit configuration of a chip with a graphic controller integrated, comprising: a main control module, including at least one front side bus (FSB) controller connected through a front side bus to a central process unit (CPU) and a memory controller connected through a memory bus to a memory; a graphic controller, for processing the requests and operation for a graphic display, an accelerated graphic port and a graphic engine; and a test circuit, installed in said main control module so as to allow said graphic controller to be directly connected to said buses through said test circuit in a testing mode; wherein, in said testing mode, said test circuit processes a plurality of testing data at a rate which is a plurality of times the data transmission rate of said graphic controller.

The present invention further provides a method for testing a circuit configuration, comprising steps of: providing a plurality of testing requests and a plurality of testing data corresponding to said testing requests; activating a testing mode so as to allow a graphic controller to be connected through a test circuit to a front side bus and a memory bus; transmitting said testing requests to said graphic controller through said test circuit by using said front side bus; and obtaining tested results of said graphic controller by comparing said testing data corresponding to said testing requests.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE INVENTION

The present invention providing a chip with graphic controller integrated and a method for testing such a circuit configuration can be exemplified by the preferred embodiment as described hereinafter.

Figure 1:
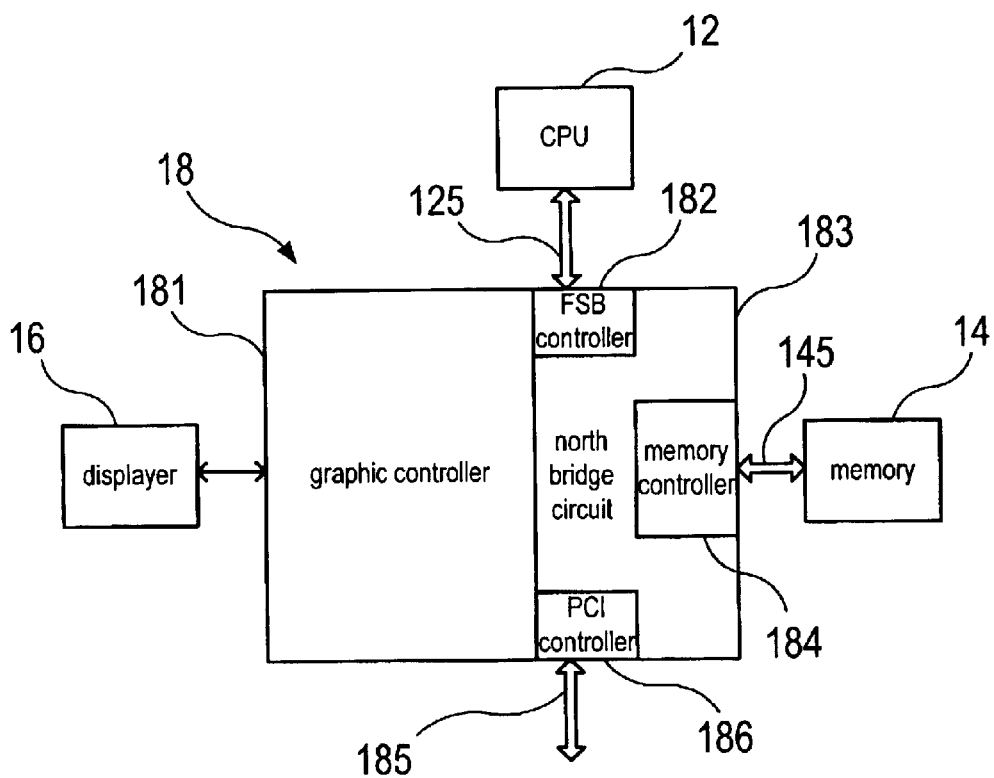
FIG. 1 is a circuit block diagram showing the north bridge chip with a graphic controller integrated and its peripheral components in accordance with the prior art.
Figure 2:
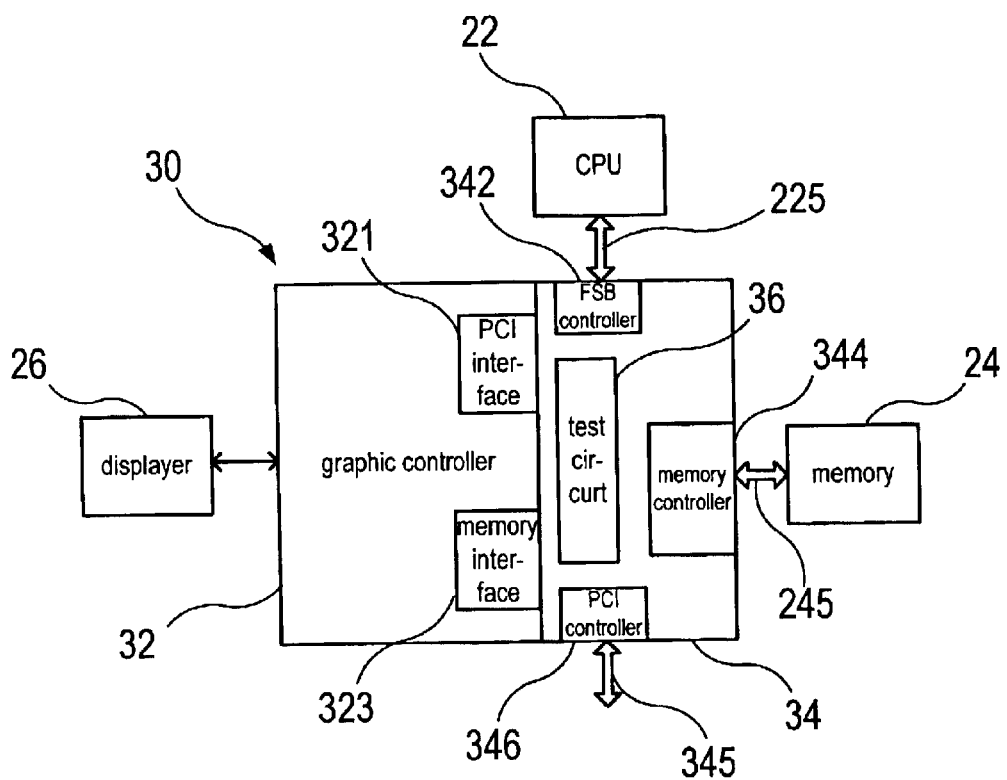
FIG. 2 is a circuit block diagram in accordance with one preferred embodiment of the present invention.

To start with, please refer to FIG. 2, which is a circuit block diagram in accordance with one preferred embodiment of the present invention. As shown in the figure, the integrated chip 30 mainly comprises a graphic controller 32 and a north bridge circuit 34. The graphic controller 32 includes a PCI interface 321 and a memory interface 323 and is connected to a displayer 26. The north bridge circuit 34 includes a front side bus (FSB) controller 342, a memory controller 344 and a PCI controller 346. The FSB controller 342 is connected through a front side bus 225 to a central process unit 22. The memory controller 344 is connected through a memory bus 245 to a memory 24. The PCI controller 346 is connected through a PCI bus 345 to the corresponding peripheral components. The north bridge circuit 34 further includes a test circuit 36 so as to allow the graphic controller 32 to be directly connected to the buses through the test circuit 36 instead of other controllers in a testing mode. Therefore, the testing of the graphic controller 32 in the integrated chip 30 can be performed independently of the north bridge circuit. Even though the specification of north circuit is continuously updated, the same testing requests as well as the corresponding data can be used as long as the employed graphic controller is still the same, which may significantly reduce the time interval between the new product and the old one.

Figure 3:
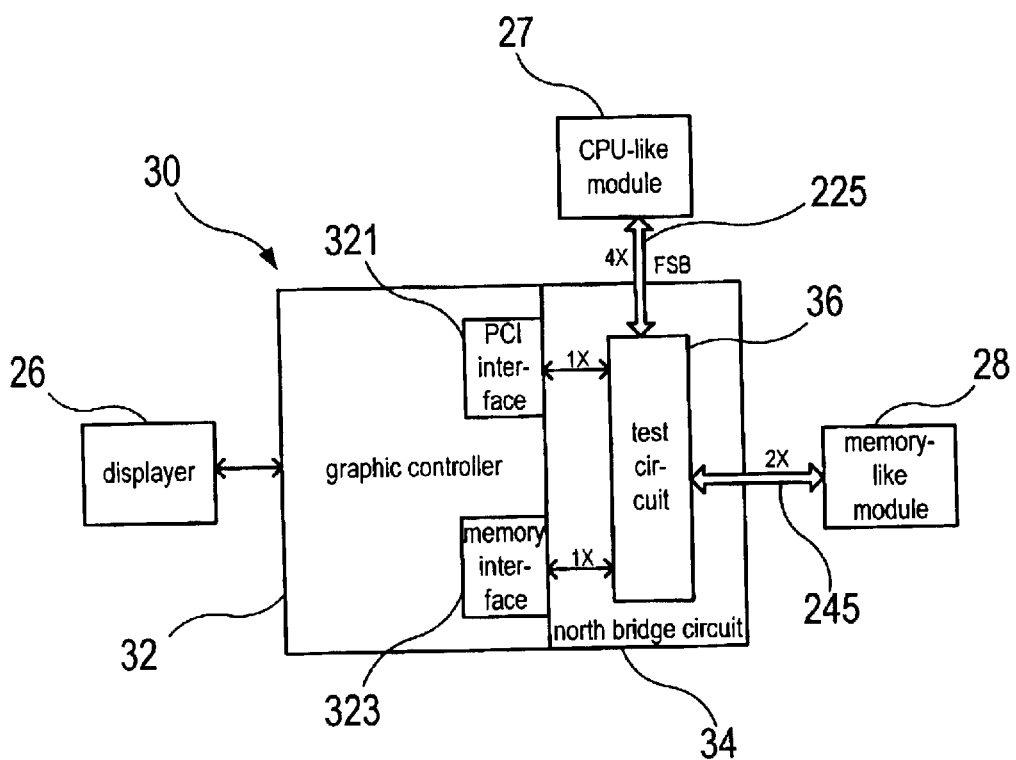
FIG. 3 shows a circuit block diagram in the testing mode in accordance with one preferred embodiment of the present invention.
Figure 4:
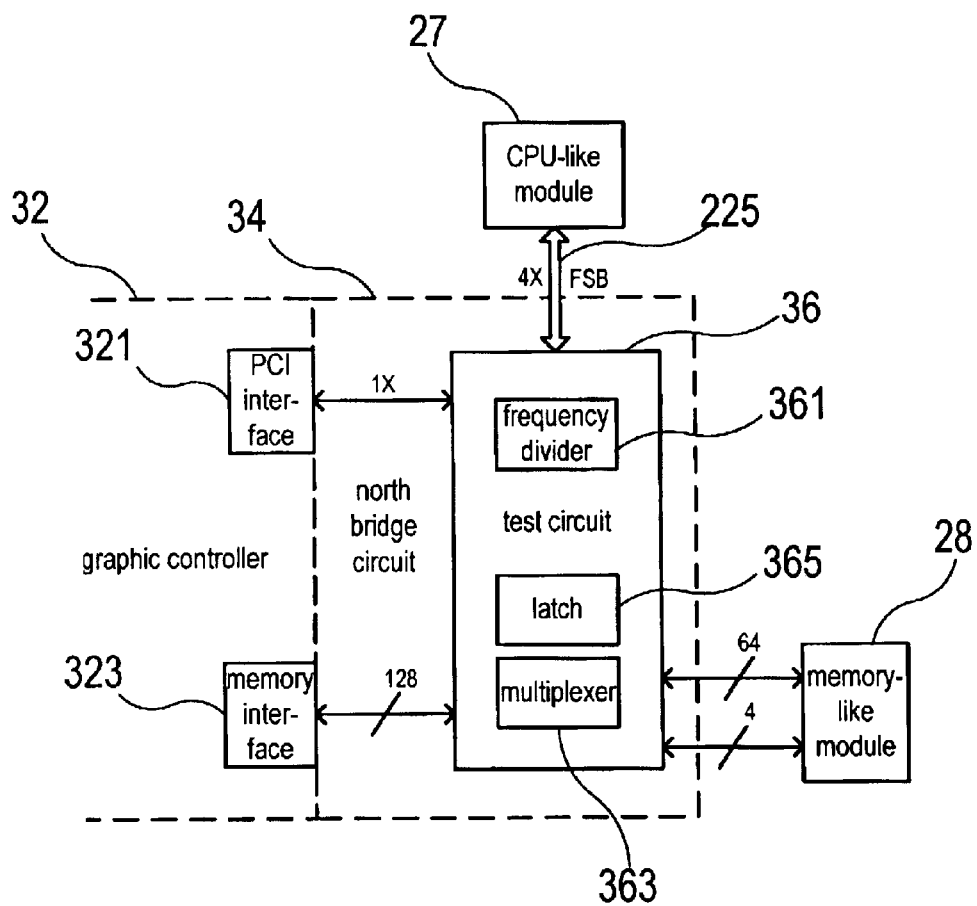
FIG. 4 shows an enlarged circuit block diagram in the testing mode in accordance with one preferred embodiment of the present invention.

Furthermore, please refer to FIG. 3 and FIG. 4, which show a circuit block diagram and an enlarged diagram in accordance with one preferred embodiment of the present invention, respectively. When an integrated chip 30 is to be tested, the integrated chip 30 is placed upon a testing system where there is a CPU-like module 27 for simulating the performance of a CPU and generating a testing request into the integrated chip 30. Similarly, on the testing system, there is also a memory-like module 28 for simulating the performance of a memory.

As shown in the figures, the test circuit 36 according to the present invention further comprises a frequency divider 361, a latch 365, and a multiplexer 363. In the preferred embodiment, the testing mode allows the graphic controller 32 to be connected through the test circuit 36 to the plurality of buses. During testing, the CPU-like module 27 transmits the testing requests such as a graphic display request, an accelerated graphic port request, and a graphic engine request to the test circuit 36 from the front side bus 225 to the test circuit 36 in the frequency quadruple mode. Then the testing request is converted by the frequency divider 361 into a single frequency mode and transmitted through the PCI interface 321 to the graphic controller 32 such that the required pin count is lowered to one quarter.

Moreover, when the graphic controller 32 accesses the data from the memory-like module 28, it can directly access the memory bus 245 through the test circuit 36 by employing the memory interface 323. The memory interface 323 transmits signals to the test circuit 36 by using 128 signal lines. The multiplexer 363 successively selects the 64 high level bits and the 64 low level bits of the signals according to the high and low levels of the clock signal so as to output the data by using the 64 data buses of the memory bus 245. Furthermore, when the data from memory like module 28 is input, the latch 365 picks up data signals from 64 data buses in the memory bus 245 according to the high and low levels of the clock signal, and then transmits the data signals to the graphic controller 32 through 128 signal lines and the memory interface 323. Finally, the graphic controller 32 is determined to pass the testing or not according to the received data by the memory-like module or the specific output pin of the integrated chip 30. In addition, 2 to 4 signal lines for transmitting control signals of the memory bus 245 can be used to identify the testing requests (such as one of a graphic display request, an accelerated graphic port request, a graphic engine request and their combination) so as to significantly lower the pin count required for testing at the memory end.

Therefore, the present invention allows the testing of the graphic controller to be independent of the north bridge such that the same testing requests can be used for any other integrated chip with different specifications but the same graphic controller. This saves the time for obtaining a new set of tested data and further lowers the required pin count, which effectively solves the problems related to insufficient pin count. In addition, even though the present invention is exemplified by an application for a north bridge circuit, it is not thus limited and is applicable to a chip integrating a graphic core, a south bridge and a north bridge circuit.

According to the above discussion, it is apparent that the present invention discloses a circuit configuration of a chip with a graphic controller integrated and a method for testing such a circuit configuration, in which a test circuit is employed in a main control module such that a graphic controller is directly connected to a plurality of buses. In this manner, a plurality of testing requests are transmitted to the graphic controller by using frequency multiplying modes and the required pin count for testing is lowered by using at least one multiplexer at the memory end. Therefore, the present invention has been examined to be progressive, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A circuit configuration of a chip with a graphic controller integrated, comprising:

a main control module including at least one front side bus (FSB) controller for connection through a front side bus to a central process unit (CPU) and a memory controller for connection through a memory bus to a memory;

a graphic controller for processing the requests and operation for a graphic display, an accelerated graphic port and a graphic engine; and, a test circuit installed in said main control module so as to allow said graphic controller in a testing mode to bypass said controllers of said main control module and be directly connected to said buses through said test circuits;

wherein, in said testing mode, said test circuit processes a plurality of testing data at a rate which is a plurality of times the data transmission rate of said graphic controller.

2. The circuit configuration as claimed in claim 1, wherein said graphic controller comprises a peripheral component interconnect (PCI) interface connected through said test circuit to said front side bus.

3. The circuit configuration as claimed in claim 1, wherein said graphic controller comprises a memory interface connected through said test circuit to said memory bus.

4. The circuit configuration as claimed in claim 1, wherein said test circuit comprises at least one multiplexer and one latch so as to lower the required pin count between said test circuit and corresponding buses.

5. The circuit configuration as claimed in claim 1, wherein said main control module is a north bridge circuit.

6. The circuit configuration as claimed in claim 1, wherein said main control module is a circuit integrating a north bridge circuit and a south bridge circuit.

7. A circuit configuration of a chip with a graphic controller integrated, comprising:

a main control module including at least one front side bus (FSB) controller for connection through a front side bus to a central process unit (CPU) and a memory controller for connection through a memory bus to a memory;

a graphic controller for processing the requests and operation for a graphic display, an accelerated graphic port and a graphic engine; and, a test circuit installed in said main control module so as to allow said graphic controller to be directly connected to said buses through said test circuit in a testing mode;

wherein in said testing mode, said test circuit processes a plurality of testing data at a rate which is a plurality of times the data transmission rate of said graphic controller;

wherein said test circuit comprises a frequency converter for converting the clock frequency of data transmission between said front side bus and said graphic controller.

8. The circuit configuration as claimed in claim 7, wherein said frequency converter is a frequency divider.

9. A method for testing a circuit configuration of a chip having a graphic controller integrated with a main control module, comprising steps of:

providing a plurality of testing requests and a plurality of testing data corresponding to said testing requests;

activating a testing mode so as to allow the graphic controller to bypass the main controller module and be directly connected through a test circuit to a front side bus and a memory bus;

transmitting said testing requests to said graphic controller through said test circuit by using said front side bus; and obtaining tested results of said graphic controller by comparing said testing data corresponding to said testing requests.

10. The method as claimed in claim 9, wherein said graphic controller comprises a memory interface and said test circuit comprises a multiplexer and a latch such that data is transmitted between a data bus of said memory bus and said memory interface.

11. The method as claimed in claim 10, wherein said test circuit identifies said testing requests by using a plurality of controlling lines of said memory bus.

12. The method as claimed in claim 9, wherein said plurality of testing requests include one of a graphic display request, an accelerated graphic port request, a graphic engine request and their combination.

13. A method for testing a circuit configuration, comprising the steps of:

providing a plurality of testing requests and a plurality of testing data corresponding to said testing requests;

activating a testing mode so as to allow a graphic controller to be connected through a test circuit to a front side bus and a memory bus;

transmitting said testing requests to said graphic controller through said test circuit by using said front side bus; and, obtaining tested results of said graphic controller by comparing said testing data corresponding to said testing requests;

wherein said graphic controller comprises a PCI interface and said test circuit comprises a frequency divider, wherein said plurality of testing requests are transmitted to said test circuit by using a frequency multiplying mode and then converted by said frequency divider into a single-frequency mode transmitted through said PCI interface to said graphic controller.

14. The method as claimed in claim 13, wherein said plurality of testing requests are transmitted to said test circuit by using a frequency quadruple mode.

* * * * *